(12) United States Patent
Shah et al.

(10) Patent No.: US 7,755,348 B1
(45) Date of Patent: Jul. 13, 2010

(54) CURRENT SENSOR OUTPUT MEASUREMENT SYSTEM AND METHOD

(75) Inventors: Pulkit Shah, Bangalore (IN); Gajender Rohilla, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/413,559

(22) Filed: Mar. 28, 2009

(51) Int. Cl.
*G01R 1/30* (2006.01)

(52) U.S. Cl. .................................................. 324/123 R

(58) Field of Classification Search ............ 324/123 R, 324/117 R, 117 H, 765, 158.1, 763, 769; 327/51–52, 127, 246, 266, 274
See application file for complete search history.

(56) References Cited

U.S. PATENT DOCUMENTS

| | | | | |
|---|---|---|---|---|
| 5,422,643 A | * | 6/1995 | Chu et al. | 341/141 |
| 6,160,404 A | * | 12/2000 | Schenk | 324/464 |
| 7,138,819 B2 | * | 11/2006 | Hashimoto | 324/765 |

\* cited by examiner

*Primary Examiner*—Ha Tran T Nguyen
*Assistant Examiner*—Tung X Nguyen

(57) ABSTRACT

Analog channel calibration methods, devices and systems are disclosed. One embodiment of the present invention pertains to a method for calibrating a channel offset of a current sensor which comprises measuring a channel offset native to a current sensor channel. The method also comprises storing the channel offset native to the current sensor channel to a register associated with the current sensor channel as a value. Additionally, the method comprises calibrating an output signal generated in response to an input signal to the current sensor channel based on the value.

20 Claims, 5 Drawing Sheets

US 7,755,348 B1

CURRENT SENSOR OUTPUT MEASUREMENT SYSTEM AND METHOD

FIELD OF TECHNOLOGY

Embodiments of the present invention relate to the field of electronics. More particularly, embodiments of the present invention relate to a calibration device, system and method.

BACKGROUND

A current sensor channel may comprise a trans-impedance amplifier (TIA), a gain amplifier (GA) and a sample and hold (SH) circuit coupled in series to transform an input current into a voltage signal. The voltage signal is then converted to digital data by an analog-to-digital converter (ADC) for subsequent processing. While processing the data, the current sensor channel, due to its analog nature, may experience an offset associated with its individual component. For example, there may be an offset associated with the TIA and an offset associated with the GA. Furthermore, there may be an offset component caused by an environmental and/or process related factor associated with the current sensor channel. These offset components may vary between the channels and may vary over time.

A number of techniques for correcting the channel offset with the individual components, such as the TIA and GA, have been used. For example, an additional SH circuit may be added to the GA to sample and remove an offset associated with the TIA. In addition, a trimming circuit may also be added to trim the offset associated with the current sensor channel. However, analog offset correction using available tools may not be able to satisfactorily correct the channel offset. Moreover, some corrective measures often take significant chip resources in the design. For example, implementing a trimming circuit in the chip often takes up a sizable real estate in the chip, and it takes time to calibrate the trimming circuit in the factory. Additionally, the results obtained from the available tools may not be satisfactory as the channel offset may change with a parameter change in the channel as well as other environment related factors (e.g., temperature, humidity, etc.) and/or process related factors.

SUMMARY

One embodiment of the present invention pertains to a method for measuring an output of a current sensor which comprises measuring a channel offset native to an analog current sensor channel. The method also comprises storing the channel offset native to the current sensor channel to a register associated with the current sensor channel as a digital value. Additionally, the method comprises using the digital value to calibrate an output signal generated by the analog current sensor channel in response to an input signal applied to the analog current sensor channel.

Another embodiment of the present invention pertains to a measurement system for a current sensor circuit. The measurement system comprises an analog current sensor channel which includes a first amplifier module for converting an input current into a first amplifier output voltage, a second amplifier module for amplifying the first amplifier output voltage to generate a second amplifier output voltage and a sample and hold module for sampling and holding the second amplifier output voltage. The measurement system also comprises an analog-to-digital converter for converting the second amplifier output voltage into a digital output data. The measurement system further comprises a calibration module coupled to the analog-to digital-converter and configured for calibrating the digital output data based on a stored channel offset native to the current sensor channel, where the channel offset native to the analog current sensor channel is measured by reading a digital output data responsive to a null signal applied as an input current to the first amplifier module. The stored channel offset native to the current sensor channel may be obtained when the channel is reset, and the stored channel offset may be stored to a digital memory.

Yet another embodiment of the present invention pertains to a current sensor device. The current sensor device comprises a plurality of analog current sensor channels, where each analog current sensor channel includes a first amplifier module for converting an input current into a first amplifier output voltage, a second amplifier module for amplifying the first amplifier output voltage to generate a second amplifier output voltage and a sample and hold module for holding the second amplifier output voltage. In addition, the current sensor device includes an analog-to-digital converter for converting the second amplifier output voltage into a digital output data. The current sensor device further includes a calibration module coupled to the analog-to digital-converter and configured for calibrating the digital output data based on a stored channel offset native to said each analog current sensor channel, where the channel offset native to the current sensor channel is measured by reading a digital output data responsive to a null signal applied as an input current to the first amplifier module.

In the above embodiments, the stored channel offset can be computed periodically by self calibration procedures, and the correction based on the self-calibration procedures may therefore adapt to environmental changes or process-related factors.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Embodiments of a method, device and/or system are disclosed that self calibrate an offset associated with an analog channel that is sampled by a digital channel. In these embodiments, an offset value native to a current sensor channel may be measured and stored in a register memory as a digital value before any data processing is initiated via the current sensor channel. When data are collected, the offset native to the current sensor channel may be reduced or removed by subtracting this value from the collected data. The calibration of the channel, which measures and stores the current channel offset, may be periodically repeated to account for a change in any of the sensor components. Since the calibration can be performed by utilizing existing resources (e.g., a digital signal processor, TIA circuits, GA circuits, SH circuits, etc.) by adding only a few additional components (e.g., digital registers), these embodiments may add very little chip area. Furthermore, since this calibration procedure is not prone to environmental changes or process changes, the offset removal is effective in reducing any remaining offset to an insignificant size relative to the magnitude of the actual signal being processed.

Thus, embodiments of this invention provide a self calibration technique which may be less obtrusive and more useful in reducing an offset native to an analog channel that is sampled by its digital counterpart. Through implementing a calibration module which oversees the calibration process and a few digital registers which store calibration information, the embodiments provide precise and adaptive calibration device, system and method.

Reference will now be made in detail to the embodiments of the invention, examples of which are illustrated in the accompanying drawings. While the invention will be described in conjunction with the embodiments, it will be understood that they are not intended to limit the invention to these embodiments. On the contrary, the disclosure is intended to cover alternatives, modifications and equivalents, which may be included within the spirit and scope of the invention. Furthermore, in the detailed description, numerous specific details are set forth in order to provide a thorough understanding of the present disclosure. However, it will be obvious to one of ordinary skill in the art that the present disclosure may be practiced without these specific details. In other instances, well known methods, procedures, components, and circuits have not been described in detail as not to unnecessarily obscure aspects of the present invention.

Figure 1:
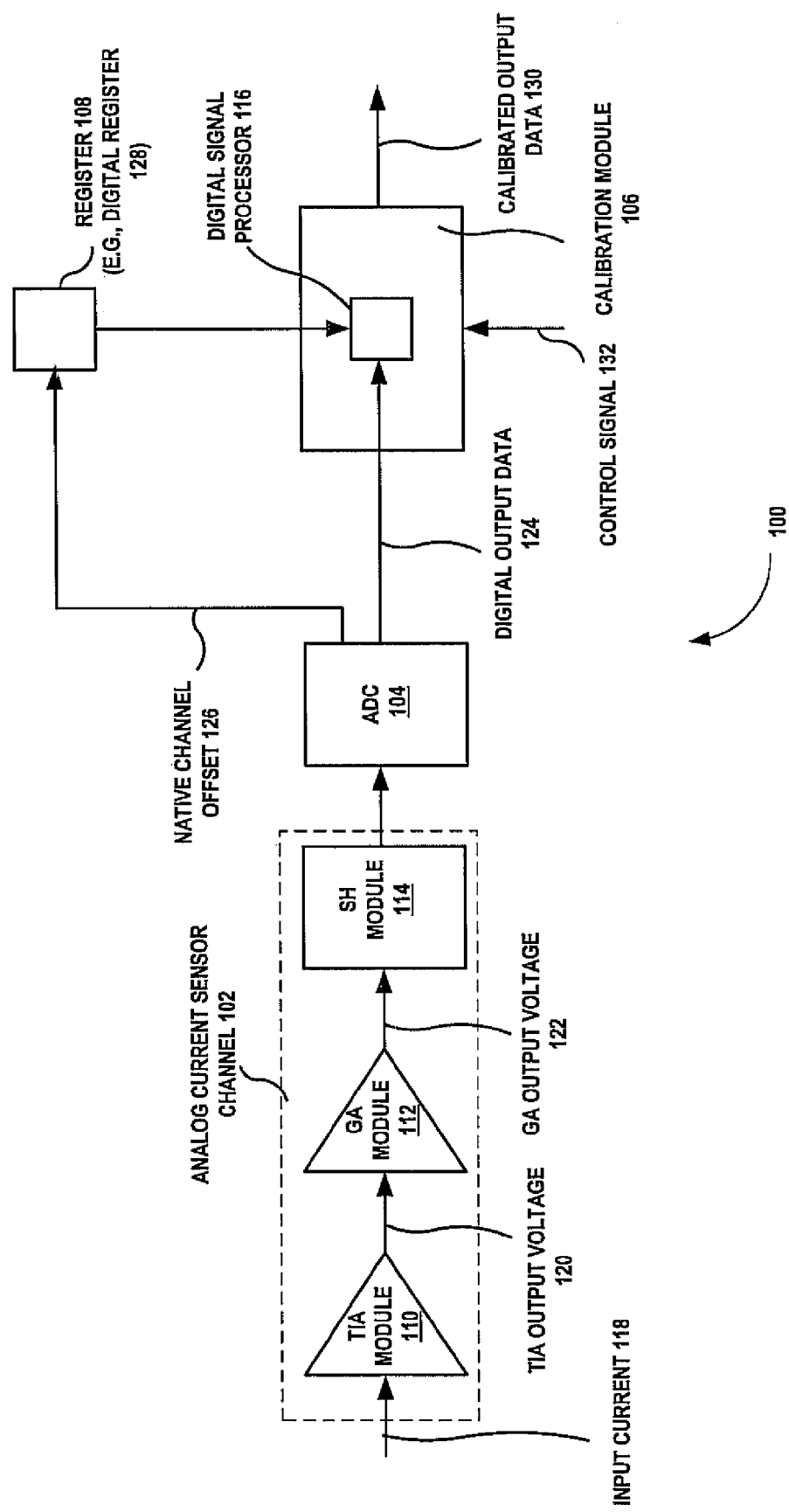
FIG. 1 illustrates an exemplary calibration system for a current sensor, according to one embodiment of the present invention.

FIG. 1 illustrates an exemplary calibration system 100 for a current sensor, according to one embodiment of the present invention. In FIG. 1, the calibration system 100 comprises a current sensor channel 102 (e.g., an analog circuit), an analog-to-digital converter (ADC) 104 (e.g., an ADC circuit) and a calibration module 106. The calibration system 100 further comprises a register 108 (e.g., a digital register 128 or any type of memory). The current sensor channel 102 includes a trans-impedance module (TIA) 110 (e.g., a TIA circuit), a gain amplifier (GA) module 112 (e.g., a GA circuit) and a sample and hold (SH) module 114 (e.g., a SH circuit) coupled in series. The calibration module 106 further includes a digital signal processor (DSP) 116.

In operation, the TIA module 110 converts an input current 118 into a TIA output voltage 120 signal. The GA module 112 then amplifies the TIA output voltage signal 120 to generate a GA output voltage signal 122. The SH module 114 samples and holds the gain amplifier output voltage signal 122. Then, the ADC 104 converts the GA output voltage signal 122 into a digital output data 124. Furthermore, the calibration module 106 that is coupled to the ADC 104 and the register 108 is configured for calibrating the digital output data 124 based on a native channel offset 126 that is associated with the current sensor channel 102. In one example embodiment, the native channel offset 126 may be measured by first applying a null signal as the input current 118 to the current sensor channel 102, and then reading the digital output data 124 generated in response to the null signal. The register 108 (e.g., a digital register 128) stores the native channel offset 126 as a digital value for subsequent use in data collection.

The calibration module 106 is configured to perform calibration of an offset present in the current sensor channel 102 by (a) measuring the native channel offset 126 in response to a null signal applied to the TIA module 110, (b) storing the native channel offset 126 to the register 108 as a value and (c) correcting the digital output data 124 generated in response to the input current 118 to the current sensor channel 102 based on the stored offset value. During the calibration of the digital output data 124, the value in the register 108 may be accessed and subtracted from the digital output data 124 to generate a calibrated output signal 130 (e.g., a digital signal). In one example embodiment, the DSP 116 may perform the subtraction. In one embodiment, the value in the register 108 may be periodically updated by repeating steps (a) and (b) if there is a parameter change (e.g., a gain in the TIA module 110, a gain in the GA module 112, etc.) in the current sensor channel 102. In another embodiment, the value in the register 108 may be periodically updated (e.g., every 5 minutes, 30 minutes, etc.) by repeating steps (a) and (b). In one embodiment, the update of the stored offset value may be triggered by a control signal 132 forwarded to the calibration module 106. It is appreciated that the calibration module 106 can be implemented in software, hardware, firmware, etc.

Figure 2:
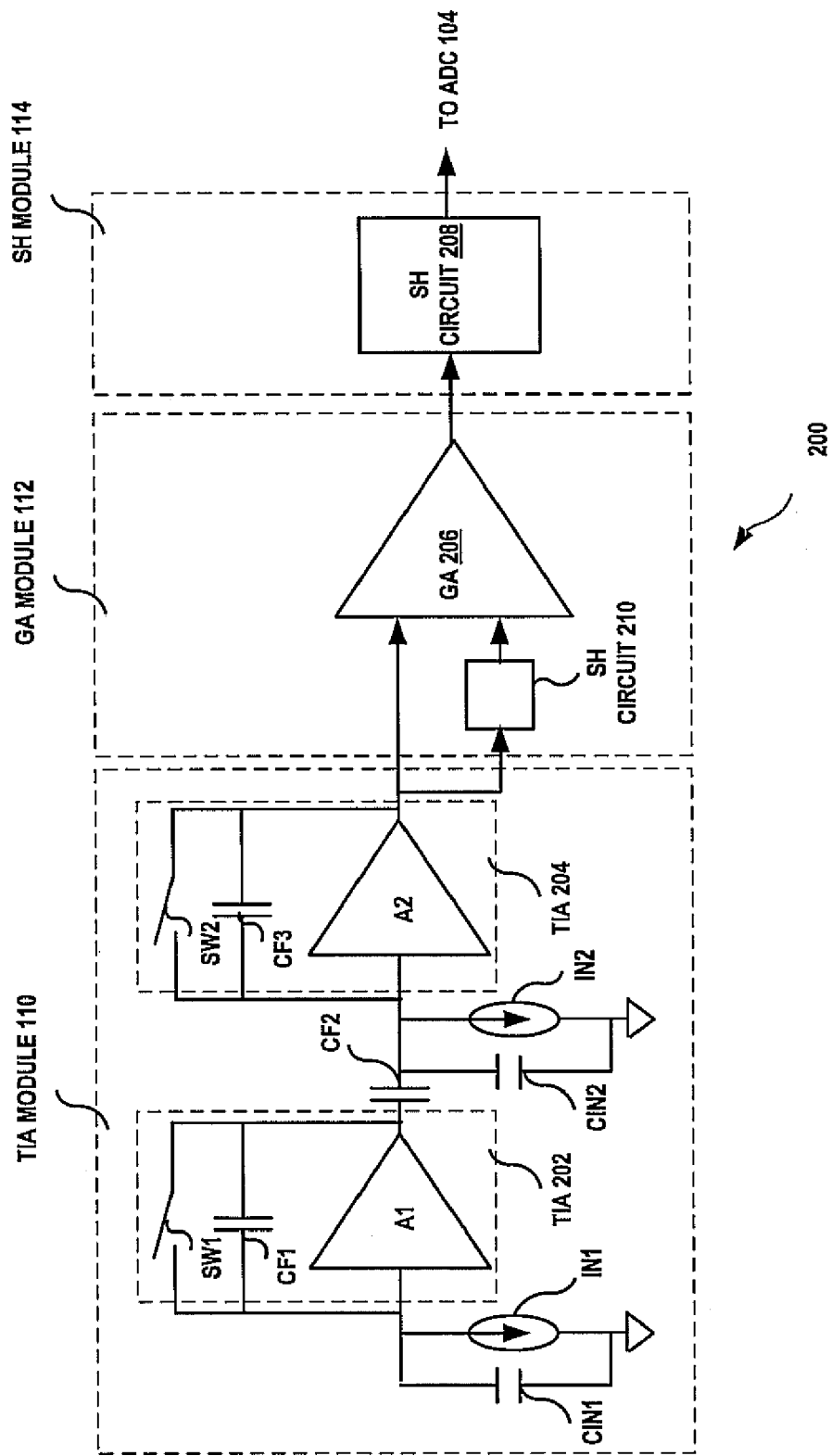
FIG. 2 illustrates an exemplary current sensor channel of the calibration system of FIG. 1, according to one embodiment of the present invention.

FIG. 2 illustrates an exemplary current sensor channel 200 of the calibration system 100 of FIG. 1, according to one embodiment of the present invention. It is appreciated that the current sensor channel 200 is an example embodiment of the current sensor channel 102 of FIG. 1. In FIG. 2, the current sensor channel 200 comprises a TIA 202, a TIA 204, a GA 206 and a SH circuit 208. It is appreciated that the TIA 202 (e.g., an amplifier A1 with a capacitive feedback loop CF1 and a switch SW1 in parallel) and the TIA 204 (e.g., an amplifier A2 with a capacitive feedback loop CF3 with a switch SW2 in parallel) in cascade via a capacitor CF2 are an example embodiment of the TIA module 110 of FIG. 1. It is also appreciated that the GA 206 is an example embodiment of the GA module 112. It is further appreciated the SH circuit 208 is an example embodiment of the SH module 114.

In one embodiment, the TIA 202 and the TIA 204 compose a differential trans-impedance amplifier which takes a differential input current (e.g., a difference between a current IN1 and a current IN2) and transforms the differential input current into a TIA output voltage. In one example embodiment, the input current IN1 (e.g., in parallel with an input capacitance CIN1) and the input current IN2 (e.g., in parallel with an input capacitance CIN2) may be forwarded by two different photodiode cells in a photo sensor array for an electronic device (e.g., an optical mouse, an optical finger navigation device, etc.). Thus, a mouse or finger movement may be tracked by processing the two input currents IN1 and IN2. Since the common mode of the two input currents may not be useful in the tracking operation, it may be eliminated using the differential TIA as illustrated in FIG. 2.

The GA module 112 may amplify the TIA output by a set gain value (e.g., 1×, 2×, 4×, etc.). In one embodiment, the GA module 112 further comprises a SH circuit 210, which may be operable for performing a correlated double sampling to remove an offset associated with the TIA 202 and the TIA 204. During the double sampling operation, the SH circuit 210 takes two samples of the TIA module 110 in two different instances to reduce an offset associated with the TIA module 110. The output of the SH circuit 208 is supplied to the ADC module 104.

Figure 3:
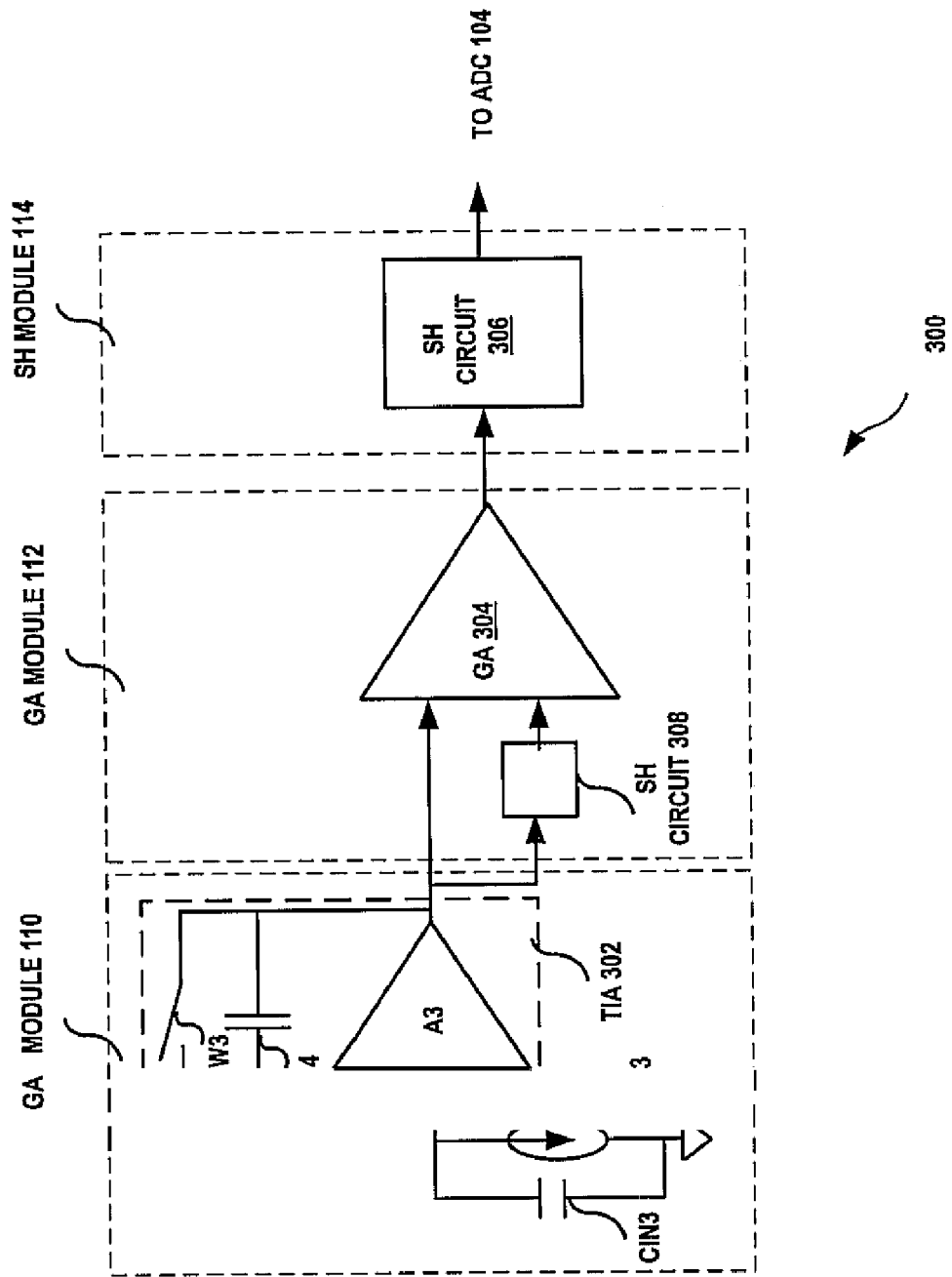
FIG. 3 illustrates another exemplary current sensor channel of the calibration system of FIG. 1, according to one embodiment of the present invention.

FIG. 3 illustrates another exemplary current sensor channel 300 of the calibration system 100 of FIG. 1, according to one embodiment of the present invention. It is appreciated that the current sensor channel 300 is an example embodiment of the current sensor channel 102. In FIG. 3, the current sensor channel 300 comprises a TIA 302, a GA 304 and a SH circuit 306. It is appreciated that the TIA 302 (e.g., an amplifier A3 with a capacitive feedback loop CF4 and a switch SW3 in parallel) is an example embodiment of the TIA module 110 of FIG. 1. It is also appreciated that the GA 304 is an example embodiment of the GA module 112. It is further appreciated the SH circuit 306 is an example embodiment of the SH module 114.

In one embodiment, the TIA 302 is a single-ended trans-impedance amplifier which takes a single input current IN3 and transforms the input current IN3 (e.g., in parallel with an input capacitance IN3) into a TIA output voltage. In one embodiment, the single-ended TIA may be used for automatic gain control amplification. For instance, the current sensor channel 300 may be coupled to a photodiode in a photo sensor array to probe the average illumination reaching the photo sensor array. The GA module 112 may amplify the TIA output by a set gain value (e.g., 1×, 2×, 4×, etc.). In one embodiment, the GA module 112 further comprises a SH circuit 308, which may be operable for performing a single sampling to remove an offset associated with the TIA 302. The output of the SH circuit 306 is supplied to the ADC module 104.

Figure 4:
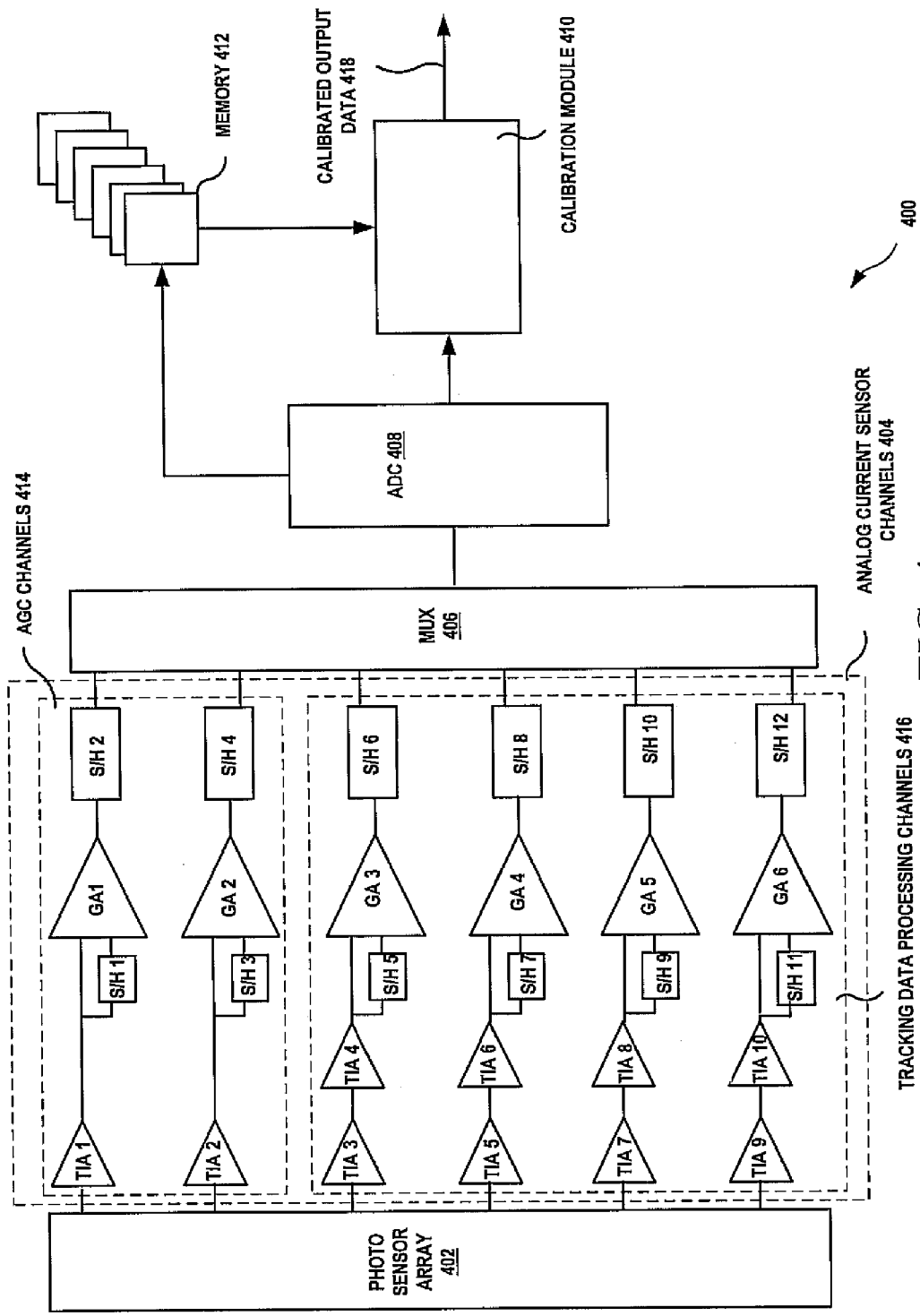
FIG. 4 illustrates an exemplary current sensor device with the calibration system of FIG. 1, according to one embodiment of the present invention.

FIG. 4 illustrates an exemplary current sensor device 400 with the calibration system 100 of FIG. 1, according to one embodiment of the present invention. In FIG. 4, the current sensor device 400 comprises a photo sensor array 402 (e.g., a photo diode array), a plurality of current sensor channels 404, a multiplexer 406, an ADC 408, a calibration module 410 and a memory 412 comprising a plurality of registers. In one embodiment, the current sensor channels 404 comprise one or more automatic gain control (AGC) channels 414, where each AGC channel includes a single-ended trans-impedance amplifier (e.g., TIA 1 or TIA 2). It is appreciated that each AGC channel may be used to process data for probing the average illumination reaching the photo sensor array 402. In one embodiment, the current sensor channels 404 comprise one or more tracking data processing channels 416, where each tracking data processing channel includes a differential trans-impedance amplifier (e.g., TIA 3 & TIA 4, TIA 5 & TIA 6, TIA 7 & TIA 8, TIA 9 & TIA 10, etc.). It is appreciated that each tracking data processing channels 416 may be used to process data for tracking a finger or mouse movement detected by the photo sensor array 402.

In one embodiment, each current sensor channel includes a TIA module for converting an input current into a TIA output voltage, a GA module for amplifying the TIA output voltage to generate a GA output voltage and a SH module for sampling and/or holding the GA output voltage. The multiplexer 406 coupled between the current sensor channels 404 and the ADC 408 selects one of the current sensor channels 404 to forward the GA output voltage to the ADC 408. The ADC 408 converts the GA output voltage into a digital output data. The calibration module 410 is coupled to the ADC 408 and is configured for calibrating the digital output data to generate calibrated output data 418 based on a channel offset native to the current sensor channel. In one embodiment, the channel offset native to the current sensor channel may be measured by reading the digital output data when a null signal is applied as the input current. In one example embodiment, the null signal may be realized by blocking any input processed through the current sensor channels 404 (e.g., turning off the light source illuminating the photo sensor array 402). Although FIG. 4 illustrates two AGC channels and four tracking data processing channels 416, it is appreciated that many more and/or different types of analog channels can be implemented and calibrated using the calibration module 410. Each channel in FIG. 4 has a respective offset value stored in the memory 412 for correcting an associated output data.

Figure 5:
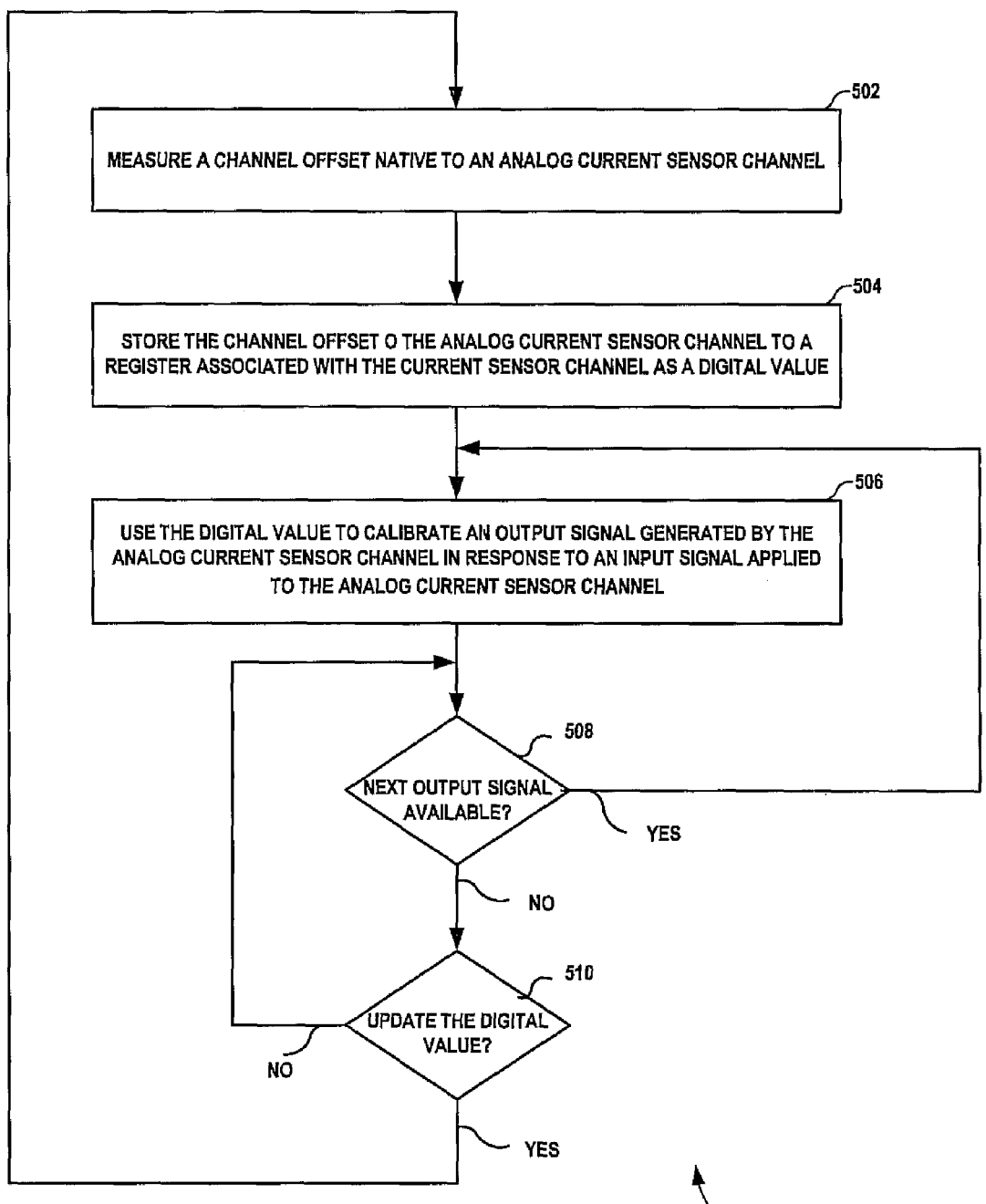
FIG. 5 illustrates a process flow chart of an exemplary method for calibrating a channel offset of a current sensor, according to one embodiment of the present invention.

FIG. 5 illustrates a process flow chart of an exemplary method 500 for calibrating a channel offset of a current sensor, according to one embodiment of the present invention. In operation 502, a channel offset native to an analog current sensor channel is measured. During the measurement, a null signal may be applied as an input signal to the analog current sensor channel, and the output signal generated in response to the null signal may be read. In operation 504, the channel offset native to the current sensor channel is stored to a register associated with the analog current sensor channel as a digital value. In operation 506, the digital value is used to calibrate an output signal generated by the analog current sensor channel in response to an input signal applied to the analog current sensor channel. During the calibration operation, the digital value may be accessed from the register and subtracted from the output signal in response to an input signal (e.g., non-zero) to generate a calibrated output signal.

In operation 508, if an update of the channel offset native to the current sensor channel is triggered (e.g., due to a parameter change in the channel, a reset trigger, a periodic update trigger, etc.), operations 502 and 504 are repeated to update the digital value in the register. It is appreciated that the methods disclosed in FIG. 5 may be implemented in a form of a machine-readable medium embodying a set of instructions that, when executed by a machine, cause the machine to perform any of the operations disclosed herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. For instance, different topologies may be used for the current sensor channel 102 in FIG. 1 in addition to TIA, GA and SH combinations as illustrated in FIG. 2 and FIG. 3. Furthermore, the embodiments described herein may be applied to correct an offset associated with any type of analog channel interfacing with its digital counterpart. Thus, the present disclosure is not intended to be limited to the embodiments shown herein but is to be accorded the widest scope consistent with the principles and features disclosed herein.

What is claimed is:

1. A method for measuring an output of a current sensor, the method comprising:
   (a) measuring a channel offset native to an analog current sensor channel;
   (b) storing the channel offset native to the current sensor channel to a register associated with the current sensor channel as a digital value; and
   (c) using the digital value to calibrate an output signal generated by the analog current sensor channel in response to an input signal applied to the analog current sensor channel.

2. The method of claim 1, wherein the measuring of the channel offset native to the analog current sensor channel comprises:
   applying a null signal as the input signal to the analog current sensor channel;
   reading an output signal generated in response to the null signal; and
   digitizing the output signal.

3. The method of claim 1, wherein the using the digital value to calibrate the output signal comprises:
 accessing the digital value from the register; and
 subtracting the digital value from the digitized output signal to generate a calibrated output signal.

4. The method of claim 1, further comprising updating the digital value in the register by repeating (a) and (b) when there is a parameter change in the analog current sensor channel.

5. The method of claim 1, further comprising periodically updating the digital value in the register by repeating (a) and (b).

6. The method of claim 1, wherein the analog current sensor channel comprises: a trans-impedance amplifier (TIA) module; a gain amplifier (GA) module; and a sample and hold (SH) module.

7. A measurement system for a current sensor circuit, the system comprising:
 an analog current sensor channel, comprising;
  a first amplifier module configured to convert an input current into a first amplifier output voltage;
  a second amplifier module configured to amplify the first amplifier output voltage to generate a second amplifier output voltage; and
  a sample and hold module configured to hold the second amplifier output voltage;
 an analog-to-digital converter configured to convert the second amplifier output voltage into a digital output data; and
 a calibration module coupled to the analog-to digital-converter and configured to calibrate the digital output data based on a stored channel offset native to the analog current sensor channel, wherein the stored channel offset is measured by reading a digital output data responsive to a null signal applied as an input current to the first amplifier module.

8. The system of claim 7, further comprising a register coupled to the analog-to-digital converter configured to store the stored channel offset native to the current sensor channel as a digital value.

9. The system of claim 7, wherein first amplifier module is a trans-impedance amplifier module and wherein the second amplifier module is a gain amplifier module.

10. The system of claim 7, wherein the calibration module comprises a digital signal processor (DSP).

11. The system of claim 9, wherein the trans-impedance amplifier module comprises a differential trans-impedance amplifier.

12. The system of claim 9, wherein the trans-impedance amplifier module comprises a single-ended trans-impedance amplifier.

13. The system of claim 9, wherein the gain amplifier module comprises a sample and hold circuit and a gain amplifier.

14. The system of claim 13, wherein the sampling and hold circuit is operable for performing a correlated double sampling to remove an offset associated with the trans-impedance amplifier module.

15. A current sensor device, comprising:
 a plurality of analog current sensor channels, each analog current sensor channel comprising:
  a first amplifier module configured to convert an input current into a first amplifier output voltage;
  a second amplifier module configured to amplify the first amplifier output voltage to generate a second amplifier output voltage; and
  a sample and hold module configured to hold the second amplifier output voltage;
 an analog-to-digital converter configured to convert the second amplifier output voltage into a digital output data; and
 a calibration module coupled to the analog-to digital-converter and configured for calibrating the digital output data based on a stored channel offset native to each of the plurality of analog current sensor channels,
  wherein the stored channel offset is measured by reading a digital output data of each analog current sensor channel responsive to a null signal applied as an input current to the first amplifier module.

16. The device of claim 15, further comprising a plurality of digital registers coupled to the analog-to-digital converter configured to store their respective stored channel offsets as digital values.

17. The device of claim 15, further comprising a photo sensor array coupled to the plurality of analog current sensor channels.

18. The device of claim 15, further comprising a multiplexer coupled between the plurality of analog current sensor channels and the analog-to-digital converter configured to select one of the plurality of current sensor channels to forward the second amplifier output voltage to the analog-to-digital converter.

19. The device of claim 15, wherein the plurality of analog current sensor channels comprises at least one automatic gain control (AGC) channel, with each automatic gain control channel comprising a single-ended trans-impedance amplifier in the first amplifier module.

20. The device of claim 15, wherein the plurality of analog current sensor channels comprises at least one tracking data processing channel, with each data processing channel comprising a differential trans-impedance amplifier in the first amplifier module.

* * * * *